US012772642B2

(12) United States Patent
Wang et al.

(10) Patent No.: US 12,772,642 B2

(45) Date of Patent: Oct. 20, 2026

(54) LIGHT-EMITTING CHIP AND PREPARATION METHOD THEREOF, LIGHT-EMITTING SUBSTRATE, DISPLAY DEVICE

(71) Applicant: BOE Technology Group Co., Ltd., Beijing (CN)

(72) Inventors: Mingxing Wang, Beijing (CN); Wei Li, Beijing (CN); Huajie Yan, Beijing (CN); Qian Sun, Beijing (CN); Guangcai Yuan, Beijing (CN); Xue Dong, Beijing (CN); Qi Qi, Beijing (CN); Xuan Liang, Beijing (CN); Fei Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 698 days.

(21) Appl. No.: 18/028,452

(22) PCT Filed: May 18, 2022

(86) PCT No.: PCT/CN2022/093680

§ 371 (c)(1),
(2) Date: Mar. 24, 2023

(87) PCT Pub. No.: WO2023/220993

PCT Pub. Date: Nov. 23, 2023

(65) Prior Publication Data

US 2024/0313036 A1 Sep. 19, 2024

(51) Int. Cl.
*H10H 29/14* (2025.01)

(52) U.S. Cl.
CPC ................................ *H10H 29/142* (2025.01)

(58) Field of Classification Search
CPC .. H10H 29/142; H10H 20/841; H10H 20/851; H10H 20/8513; H10H 20/855; H10H 29/10
See application file for complete search history.

(56) References Cited

U.S. PATENT DOCUMENTS 12,046,627 B2 * 7/2024 Kwon ................. H01L 25/0753
2017/0003423 A1 1/2017 Jiang et al.
2017/0250316 A1 * 8/2017 Yeon .................. H10H 20/8513
2018/0175268 A1 6/2018 Moon et al.
(Continued)

FOREIGN PATENT DOCUMENTS

CN 104932136 A 9/2015
CN 107134469 A 9/2017
(Continued)

*Primary Examiner* — Scott B Geyer
(74) *Attorney, Agent, or Firm* — IPro, PLLC

(57) ABSTRACT

Provided in the disclosure are a light-emitting chip and a preparation method thereof, a light-emitting substrate, and a display device. The light-emitting chip includes: a silicon-based substrate including a plurality of sub-pixel openings; a plurality of light-emitting devices formed on one side of the silicon-based substrate; wherein the light-emitting devices are in one-to-one correspondence to the sub-pixel openings, and orthographic projections of the light-emitting devices on the silicon-based substrate overlap with the sub-pixel openings; and a plurality of photoluminescent color films located in at least part of the sub-pixel openings.

20 Claims, 13 Drawing Sheets

(56) References Cited

U.S. PATENT DOCUMENTS

| | | | | |
|---|---|---|---|---|
| 2020/0152694 | A1 | 5/2020 | Lee et al. | |
| 2020/0279979 | A1 | 9/2020 | Lee et al. | |
| 2020/0395507 | A1* | 12/2020 | Lyu | H10H 29/8512 |
| 2022/0223776 | A1* | 7/2022 | Akimoto | H10H 20/851 |
| 2022/0278174 | A1 | 9/2022 | Yu et al. | |
| 2022/0285590 | A1* | 9/2022 | Mun | G02B 5/20 |

FOREIGN PATENT DOCUMENTS

| | | | | |
|---|---|---|---|---|
| CN | 108206234 | A | 6/2018 | |
| CN | 109256455 | A | 1/2019 | |
| CN | 109742249 | A | 5/2019 | |
| CN | 110720144 | A | 1/2020 | |
| CN | 110993634 | A * | 4/2020 | H10H 20/856 |
| CN | 111180430 | A | 5/2020 | |
| CN | 111505866 | A | 8/2020 | |
| CN | 111725251 | A | 9/2020 | |
| CN | 112420901 | A | 2/2021 | |
| CN | 213988888 | U | 8/2021 | |
| JP | 3174776 | U | 4/2012 | |

* cited by examiner

LIGHT-EMITTING CHIP AND PREPARATION METHOD THEREOF, LIGHT-EMITTING SUBSTRATE, DISPLAY DEVICE

CROSS REFERENCE TO RELATED APPLICATIONS

The present disclosure is a US National Stage of International Application No. PCT/CN2022/093680, filed on May 18, 2022, the entire contents of which are incorporated herein by reference.

FIELD

The disclosure relates to the field of display technology, and in particular to a light-emitting chip and a preparation method thereof, a light-emitting substrate, and a display device.

BACKGROUND

The micro-sized inorganic light-emitting diode display is a novel display technology that has developed rapidly in recent years. The micro-sized inorganic light-emitting diodes have many advantages such as small chip size, controllable light-emitting wavelength, high light-emitting efficiency, long service life and no pollution to the environment, so that the application of the light-emitting diodes in the display aspect has been developed.

SUMMARY

An embodiment of the disclosure provides a light-emitting chip, including:

a silicon-based substrate including a plurality of sub-pixel openings;

a plurality of light-emitting devices arranged on one side of the silicon-based substrate; where the light-emitting devices are in one-to-one correspondence to the sub-pixel openings, and orthographic projections of the light-emitting devices on the silicon-based substrate overlap with the sub-pixel openings; and a plurality of photoluminescent color films located in at least part of the sub-pixel openings.

In some embodiments, the light-emitting chip further includes:

a microlens located on a side of the silicon-based substrate away from the light-emitting devices, where the microlens covers the sub-pixel openings.

In some embodiments, the light-emitting chip further includes:

a first distributed Bragg reflection structure located between the silicon-based substrate and the microlens, covering at least the plurality of photoluminescent color films, and configured to transmit light emitted by the photoluminescent color films and reflect light emitted by the light-emitting devices.

In some embodiments, when no photoluminescent color film is included in the sub-pixel opening, an orthographic projection of the first distributed Bragg reflection structure on the silicon-based substrate does not overlap with the sub-pixel opening.

In some embodiments, the light-emitting chip further includes:

a light filter film located on a side of the microlens away from the silicon-based substrate.

In some embodiments, the light-emitting devices are micro-sized inorganic light-emitting diodes.

In some embodiments, the light-emitting device includes: N-type gallium nitride, a multi-quantum well layer and P-type gallium nitride stacked on one side of the silicon-based substrate; and the N-type gallium nitride of the plurality of light-emitting devices is integrally connected.

In some embodiments, the light-emitting chip further includes:

a plurality of first connection electrodes located on a side of the P-type gallium nitride away from the multi-quantum well layer; where the first connection electrodes are electrically connected to the P-type gallium nitride in one-to-one correspondence, and orthographic projections of the first connection electrodes on the silicon-based substrate fall into orthographic projections of the P-type gallium nitride on the silicon-based substrate;

a second connection electrode located in a region outside the light-emitting devices and electrically connected to the N-type gallium nitride on a side of the N-type gallium nitride away from the silicon-based substrate;

a protective layer, located on a side of the first connection electrodes and the second connection electrode away from the silicon-based substrate, and including: a plurality of first via holes penetrating through a thickness of the protective layer and exposing the first connection electrodes, and a second via hole penetrating through the thickness of the protective layer and exposing the second connection electrode; and a plurality of binding pads, located on a side of the protective layer away from the first connection electrodes and the second connection electrode, and including: first binding pads electrically connected to the first connection electrodes in one-to-one correspondence through the first via holes, and a second binding pad electrically connected to the second connection electrode through the second via hole.

In some embodiments, the plurality of light-emitting devices included in the light-emitting chip are all blue light-emitting devices;

the plurality of sub-pixel openings include: a red sub-pixel opening, a blue sub-pixel opening, and a green sub-pixel opening; and the plurality of photoluminescent color films include: a red light quantum dot color film that absorbs blue light and emits red light, and a green light quantum dot color film that absorbs blue light and emits green light; where the red light quantum dot color film is located in the red sub-pixel opening, and the green light quantum dot color film is located in the green sub-pixel opening.

In some embodiments, the plurality of light-emitting devices included in the light-emitting chip are all ultraviolet light-emitting devices;

the plurality of sub-pixel openings include: a red sub-pixel opening, a blue sub-pixel opening, and a green sub-pixel opening; and the plurality of photoluminescent color films include: a red light quantum dot color film that absorbs ultraviolet light and emits red light, a blue light quantum dot color film that absorbs ultraviolet light and emits blue light, and a green light quantum dot color film that absorbs ultraviolet light and emits green light; where the red light quantum dot color film is located in the red sub-pixel opening, the blue light quantum dot color film is located in the blue sub-pixel opening, and the green light quantum dot color film is located in the green sub-pixel opening.

In some embodiments, a thickness of the silicon-based substrate is greater than or equal to 5 microns and less than or equal to 50 microns.

In some embodiments, a distance between the light-emitting device and the photoluminescent color film is greater than or equal to 0.1 micron and less than or equal to 50 microns.

In some embodiments, the orthographic projections of the light-emitting devices on the silicon-based substrate fall into the sub-pixel openings.

An embodiment of the disclosure provides a preparation method of a light-emitting chip, including:

generating a light-emitting device film layer on a silicon-based substrate;

forming a plurality of light-emitting devices by performing a patterning process on the light-emitting device film layer;

forming sub-pixel openings in one-to-one correspondence to the light-emitting devices on the silicon-based substrate; and forming photoluminescence color films in at least part of the sub-pixel openings.

In some embodiments, generating the light-emitting device film layer on the silicon-based substrate, specifically includes:

generating an N-type gallium nitride layer, a multi-quantum well layer, a P-type gallium nitride layer and a first connection electrode layer sequentially on one side of the silicon-based substrate;

before forming the plurality of light-emitting devices by performing the patterning process on the light-emitting device film layer, the method further includes:

forming patterns of a plurality of first connection electrodes by performing a patterning process on the first connection electrode layer;

the forming the plurality of light-emitting devices by performing the patterning process on the light-emitting device film layer, specifically includes:

forming a pattern of P-type gallium nitride and a pattern of the multi-quantum well layer corresponding to the light-emitting devices by performing a patterning process on the P-type gallium nitride layer, multi-quantum well layer and N-type gallium nitride layer; where the N-type gallium nitride of the plurality of light-emitting devices is integrally connected;

after forming the plurality of light-emitting devices by performing the patterning process on the light-emitting device film layer, the method further includes:

forming a pattern of a second connection electrode in a region outside the light-emitting devices and on a side of the N-type gallium nitride layer away from the silicon-based substrate;

forming a protective layer covering the first connection electrodes and the second connection electrode, and forming first via holes exposing the first connection electrodes and a second via hole exposing the second connection electrode by performing a patterning process on the protective layer; and forming a binding pad layer on a side of the protective layer away from the first connection electrodes and the second connection electrode, and forming first binding pads electrically connected to the first connection electrodes through the first via holes, and a second binding pad electrically connected to the second connection electrode through the second via hole by performing a patterning process on the binding pad layer.

In some embodiments, before forming the sub-pixel openings in one-to-one correspondence to the light-emitting devices on the silicon-based substrate, the method further includes:

bonding a first substrate on a side of the first binding pads and the second binding pad away from the protective layer;

after forming a filter film on a side of a microlens away from the silicon-based substrate, the method further includes:

peeling off the first substrate.

In some embodiments, bonding the first substrate on the side of the first binding pads and the second binding pad away from the protective layer, specifically includes:

coating laser dissociation temporary bonding glue on one side of the first substrate, and contacting the first binding pads and the second binding pad on the side where the laser dissociation temporary bonding glue is coated, so that the first binding pads and the second binding pad are bonded to the first substrate;

peeling off the first substrate, specifically includes:

peeling off the first substrate from the first binding pads and the second binding pad by a laser dissociation process.

In some embodiments, forming the sub-pixel openings in one-to-one correspondence to the light-emitting devices on the silicon-based substrate, specifically includes:

performing a thinning process on the silicon-based substrate on a side of the silicon-based substrate away from the light-emitting devices; and forming the sub-pixel openings in one-to-one correspondence to the light-emitting devices by performing a dry etching process or a wet etching process on the thinned silicon-based substrate.

An embodiment of the disclosure provides a light-emitting substrate, including a plurality of light-emitting chips according to the embodiments of the disclosure arranged in an array.

An embodiment of the disclosure provides a display device, including the light-emitting substrate according to the embodiment of the disclosure.

BRIEF DESCRIPTION OF THE DRAWINGS

In order to illustrate the technical solutions in the embodiments of the disclosure more clearly, the accompanying figures which need to be used in describing the embodiments will be introduced below briefly. Obviously the accompanying figures described below are only some embodiments of the disclosure, and other accompanying figures can also be obtained by those ordinary skilled in the art according to these accompanying figures without creative labor.

DETAILED DESCRIPTION OF THE EMBODIMENTS

In order to make the purposes, technical solutions and advantages of the disclosure clearer, the technical solutions of the embodiments of the disclosure will be described clearly and completely below in combination with the accompanying drawings of the embodiments of the disclosure. Obviously the described embodiments are a part of the embodiments of the disclosure but not all the embodiments. Also in the case of no conflict, the embodiments and the features therein in the disclosure can be combined with each other. Based upon the embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The "first", "second" and similar words used in the disclosure do not represent any order, number or importance, and are only used to distinguish different components. The word such as "include" or "contain" or the like means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect.

It should be noted that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

Figure 1:
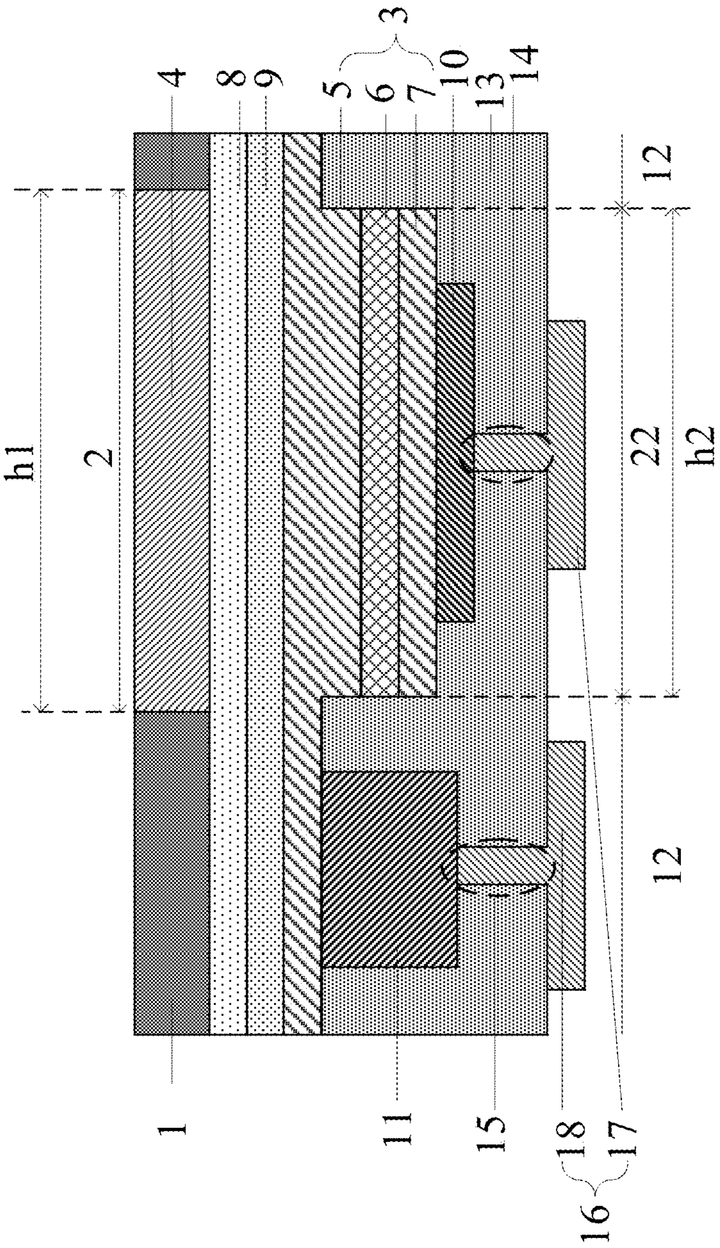
FIG. 1 is a schematic structural diagram of a light-emitting chip according to an embodiment of the disclosure.

An embodiment of the disclosure provides a light-emitting chip. As shown in FIG. 1, the light-emitting chip includes:

- a silicon-based substrate 1 including a plurality of sub-pixel openings 2;
- a plurality of light-emitting devices 3 arranged on one side of the silicon-based substrate 1; where the light-emitting devices 3 are in one-to-one correspondence to the sub-pixel openings 2, and orthographic projections of the light-emitting devices 3 on the silicon-based substrate 1 overlap with the sub-pixel openings 2; and
- a plurality of photoluminescent color films 4 located in at least part of the sub-pixel openings 2.

In the light-emitting chip provided by the embodiment of the disclosure, the photoluminescent color films are arranged in the sub-pixel openings of the silicon-based substrate, that is, the silicon-based substrate is used as a light-shielding black matrix, so that there is no need to additionally arrange a black matrix layer on the side of the silicon-based substrate away from the light-emitting devices, which can save the preparation process of the light-emitting chip and save the cost. The process of forming the sub-pixel openings on the silicon-based substrate is simple, which can avoid increasing the preparation difficulty of the sub-pixel openings. Moreover, the farther the distance from the light-emitting side of the light-emitting device is, the greater the divergence of the light emitted by the light-emitting device is, so the reflection of a part of the light between the interfaces of the light-emitting chip easily forms the crosstalk. In the light-emitting chip provided by the embodiment of the disclosure, the photoluminescent color films are arranged the sub-pixel openings of the silicon-based substrate, instead of arranging the photoluminescent color films in the openings of the black matrix layer that is additionally arranged on the side of the silicon-based substrate away from the light-emitting devices. The distances between the photoluminescent color films and the light-emitting devices can be reduced, avoiding the problem of crosstalk between different pixels.

Moreover, the light-emitting chip according to the embodiment of the disclosure includes a plurality of light-emitting devices formed on one side of the silicon-based substrate. That is, each light-emitting device included in the light-emitting chip has the same luminous color, and then the color conversion is realized by the photoluminescent color films so that the light-emitting chip achieves the full color, so as to reduce the transfer difficulty of the light-emitting chip. The plurality of light-emitting devices are formed on one side of the silicon-based substrate, so that there is no need to generate each film layer of the light-emitting devices on a temporary substrate and then transfer each film layer of the light-emitting devices to a substrate with higher supporting strength, which can further save the preparation process of the light-emitting chip and save the cost.

In some embodiments, a length and width of a light-emitting device are smaller than a length and width of a sub-pixel opening, and an area of the light-emitting device is smaller than an area of the sub-pixel opening. As shown in FIG. 1, the width h2 of the light-emitting device is smaller than the width h1 of the sub-pixel opening, and the orthographic projection of the light-emitting device 3 on the silicon-based substrate 1 falls into the sub-pixel opening 2.

In some embodiments, the light-emitting devices are micro-sized inorganic light-emitting diodes.

In some embodiments, the micro-sized inorganic light-emitting diode may be, for example, a Mini Light-emitting Diode (Mini-LED) or a Micro Light-emitting Diode (Micro-LED).

It should be noted that the Mini-LED and the Micro-LED are small in size and high in brightness, and can be widely used in the display devices or backlight modules thereof. For example, the typical size (such as length) of the Micro-LED is less than 100 microns; and the typical size (such as length) of the Mini-LED is 80 microns to 350 microns.

In some embodiments, as shown in FIG. 1, the light-emitting device 3 includes: N-type Gallium Nitride (N-GaN) 5, a Multi-Quantum Well layer (MQW) 6 and P-type Gallium Nitride (P-GaN) 7 stacked on one side of the silicon-based substrate 1.

The N-type gallium nitride of the plurality of light-emitting devices is integrally connected.

That is, the N-type gallium nitride in the light-emitting chip is arranged in a whole layer.

Figure 2:
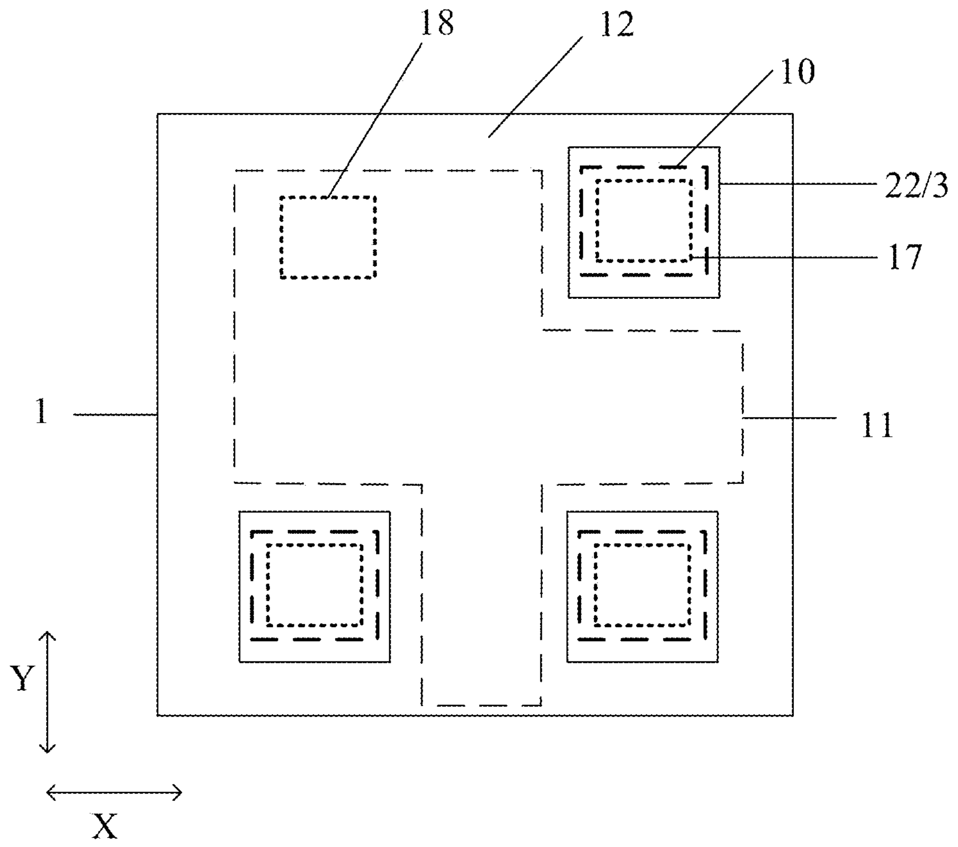
FIG. 2 is a top view of a light-emitting chip according to an embodiment of the disclosure.

In some embodiments, as shown in FIG. 2, the light-emitting chip includes three light-emitting devices 3. The region corresponding to the pattern of the N-type gallium nitride and the multi-quantum well layer in the light-emitting devices 3 is the light-emitting region 22 of the light-emitting chip, and the region outside the light-emitting devices 3 is the non-light-emitting region 12 of the light-emitting chip. That is, the N-type gallium semi-nitride extends to and is integrally connected with the non-light-emitting region.

In some embodiments, as shown in FIG. 1, the thickness of the N-GaN 5 in the non-light-emitting region 12 is smaller than the thickness of the N-GaN 5 in the region of the light-emitting devices 3. That is, the patterning processes such as etching are also performed on the N-GaN, but the N-GaN in the non-light-emitting region is not completely removed.

Figure 3:
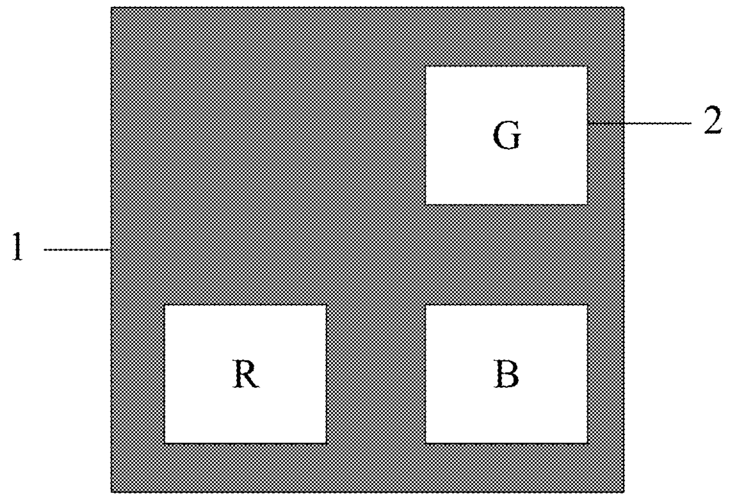
FIG. 3 is a top view of a silicon-based substrate according to an embodiment of the disclosure.

When the light-emitting chip includes three light-emitting devices, the silicon-based substrate includes three sub-pixel openings correspondingly. In some embodiments, as shown in FIG. 3, the plurality of sub-pixel openings 2 include: a red sub-pixel opening R, a blue sub-pixel opening B and a green sub-pixel opening G.

In a specific implementation, the length and/or width of the sub-pixel opening is/are greater than or equal to 10 microns and less than or equal to 100 microns; and the length and width of the sub-pixel opening may be set to, for example, 50 μm. In a specific implementation, the size of the sub-pixel opening is not larger than the size of the corresponding light-emitting region. For example, the length and width of the sub-pixel opening may be set to be both smaller than the length and width of the light-emitting region, that is, the area of the sub-pixel opening is smaller than the area of the light-emitting region, and the orthographic projection of the sub-pixel opening falls within the light-emitting region.

In some embodiments, as shown in FIG. 1, the light-emitting chip further includes: a buffer layer 8 located between the silicon-based substrate 1 and the N-type gallium nitride 5, and U-shaped Gallium Nitride (U-GaN) 9 located between the buffer layer 8 and the N-type gallium nitride 5.

In a specific implementation, each of the buffer layer and the U-GaN is arranged in a whole layer. The buffer layer is a multi-layer epitaxial structure, and the buffer layer includes, for example, Aluminum Nitride (AlN), Aluminum Gallium Nitride (AlGaN) and Gallium Nitride (GaN) stacked in sequence. The U-shaped gallium nitride is used to form a high-quality GaN layer to generate N-GaN, MQW and P-GaN sequentially.

In some embodiments, the total thickness of the buffer layer and U-GaN is greater than or equal to 0.1 μm and less than or equal to 10 μm. That is, the distance between the light-emitting device and the photoluminescent color film is greater than or equal to 0.1 micron and less than or equal to 50 microns.

In the light-emitting chip provided by the embodiments of the disclosure, the photoluminescent color films are arranged in the sub-pixel openings of the silicon-based substrate, so that the distances between the photoluminescent color films and the light-emitting devices are relatively small, and the problem of crosstalk between different sub-pixels can be avoided.

In some embodiments, as shown in FIG. 1 and FIG. 2, the light-emitting chip further includes:

a plurality of first connection electrodes 10 located on a side of the P-type gallium nitride 7 away from the multi-quantum well layer 6; where the first connection electrodes 10 are electrically connected to the P-type gallium nitride 7 in one-to-one correspondence, and the orthographic projections of the first connection electrodes 10 on the silicon-based substrate 1 fall into orthographic projections of the P-type gallium nitride 7 on the silicon-based substrate 1;

a second connection electrode 11 located in a region outside the light-emitting devices 3 and electrically connected to the N-type gallium nitride 5 on a side of the N-type gallium nitride 5 away from the silicon-based substrate;

a protective layer 13, located on a side of the first connection electrodes 10 and the second connection electrode 11 away from the silicon-based substrate 1, and including: a plurality of first via holes 14 penetrating through a thickness of the protective layer 13 and exposing the first connection electrodes 10, and a second via hole 15 penetrating through the thickness of the protective layer 13 and exposing the second connection electrode 11; and a plurality of binding pads 16, located on a side of the protective layer 13 away from the first connection electrodes 10 and the second connection electrode 11, and including: first binding pads 17 electrically connected to the first connection electrodes 10 in one-to-one correspondence through the first via holes 14, and a second binding pad 18 electrically connected to the second connection electrode 11 through the second via hole 15.

In a specific implementation, as shown in FIG. 2, when the light-emitting chip includes three light-emitting devices 3, the light-emitting chip includes three first connection electrodes 10 and three first binding pads 17, so as to provide the current to the P-type GaN through the first binding pads 17 and the first connection electrodes 10. Since the N-type GaN in the light-emitting chip is arranged in a whole layer, only one second connection electrode and one second binding pad need to be arranged, to provide the current to the N-type GaN through the second binding pad and the second connection electrode.

In some embodiments, as shown in FIG. 2, the region where the orthographic projection of the second binding pad 18 on the silicon-based substrate is located and the regions where the orthographic projections of the three light-emitting devices 3 on the silicon-based substrate form a 2×2 array. The orthographic projection of the second connection electrode 11 on the silicon-based substrate falls into the non-light-emitting region 12. The second connection electrode 11 is not only arranged in the region corresponding to the second binding pad 18, but also extends to the region between adjacent light-emitting devices 3, and the distance between the orthographic projection of the second connection electrode 11 on the silicon-based substrate and each light-emitting device 3 is equal. Therefore, there is a larger contact area between the second connection electrode and the N-type GaN, which can improve the current transmission effect between the second connection electrode and the N-type GaN.

In some embodiments, the material of the first connection electrode is Indium Tin Oxide (ITO). The thickness of ITO is 10 angstroms (Å) to 50000 Å.

In some embodiments, the second connection electrode is an alloy structure of titanium, aluminum, nickel, chromium, platinum and gold; and a typical structure is an alloy structure of titanium, aluminum, nickel and gold or an alloy structure of chromium, platinum and gold.

In some embodiments, the material of the protective layer includes, for example, silicon oxide ($SiO_2$) or silicon nitride ($SiN_x$).

Alternatively, in some embodiments, the protective layer may also be a protective layer with Bragg reflective structure, which may be a stack of $SiO_2$/$SiN_x$ or a stack of $SiO_2$/titanium oxide ($TiO_2$) or the like.

When the protective layer is a protective layer with Bragg reflective structure, the protective layer with Bragg reflective structure is used to reflect the light emitted by the light-emitting devices, so that the light emitted by the light-emitting devices will reflect toward the side of the sub-pixel openings after reaching the protective layer, thereby improving the light utilization of the light-emitting chip.

In a specific implementation, the distances between adjacent binding pads are equal in the first direction X, and the distances between adjacent binding pads are equal in the second direction Y, where the first direction X is perpendicular to the second direction Y. In a specific implementation, the length and/or width of the binding pad is/are greater than or equal to 10 μm and less than or equal to 100 μm, for example, the shape of the binding pad may be a square with a length and width of 50 μm, thereby ensuring that the distances between the binding pads are equal and as large as possible.

In a specific implementation, the thinning process may be performed on the silicon-based substrate, so that the thickness of the silicon-based substrate is greater than or equal to 5 microns and less than or equal to 50 microns, thereby reducing the overall thickness of the product. Also, since the silicon-based substrate is used as a light-shielding layer between the photoluminescent color films, the light absorption caused by too thick thickness of the silicon-based substrate can also be avoided.

In some embodiments, the thickness of the photoluminescent color film layer is not greater than the thickness of the silicon-based substrate; for example, the thickness of the photoluminescent color film layer may be set to be the same as the thickness of the silicon-based substrate. That is, the thickness of the photoluminescent color film layer is greater than or equal to 5 microns and less than or equal to 50 microns. The thickness of the photoluminescent color film layer and the thickness of the silicon-based substrate may be set to, for example, 15 microns.

In some embodiments, the plurality of light-emitting devices included in the light-emitting chip are all blue light-emitting devices.

The plurality of photoluminescent color films only include: a red light quantum dot color film that absorbs blue light and emits red light, and a green light quantum dot color film that absorbs blue light and emits green light; where the red light quantum dot color film is located in the red sub-pixel opening, and the green light quantum dot color film is located in the green sub-pixel opening. That is, as shown in FIG. 4, no photoluminescent color film is arranged in the blue sub-pixel opening B.

Figure 4:
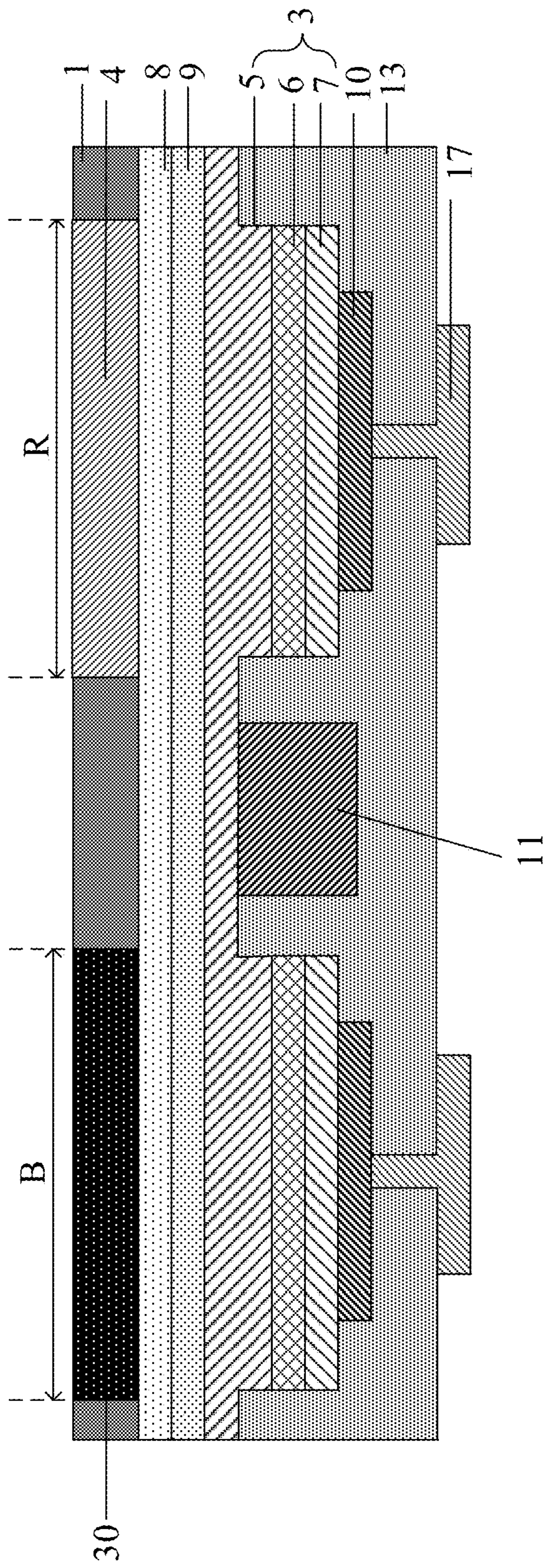
FIG. 4 is a schematic structural diagram of another light-emitting chip according to an embodiment of the disclosure.

In some embodiments, as shown in FIG. 4, the light-emitting chip further includes: a scattering particle layer 30 arranged in the blue sub-pixel opening B. The scattering particle layer 30 includes scattering particles, which can improve the brightness distribution of the blue sub-pixel from each viewing angle.

Alternatively, in some embodiments, the plurality of light-emitting devices included in the light-emitting chip are all ultraviolet light-emitting devices.

The plurality of photoluminescent color films include: a red light quantum dot color film that absorbs ultraviolet light and emits red light, a blue light quantum dot color film that absorbs ultraviolet light and emits blue light, and a green light quantum dot color film that absorbs ultraviolet light and emits green light; where the red light quantum dot color film is located in the red sub-pixel opening, the blue light quantum dot color film is located in the blue sub-pixel opening, and the green light quantum dot color film is located in the green sub-pixel opening.

Figure 5:
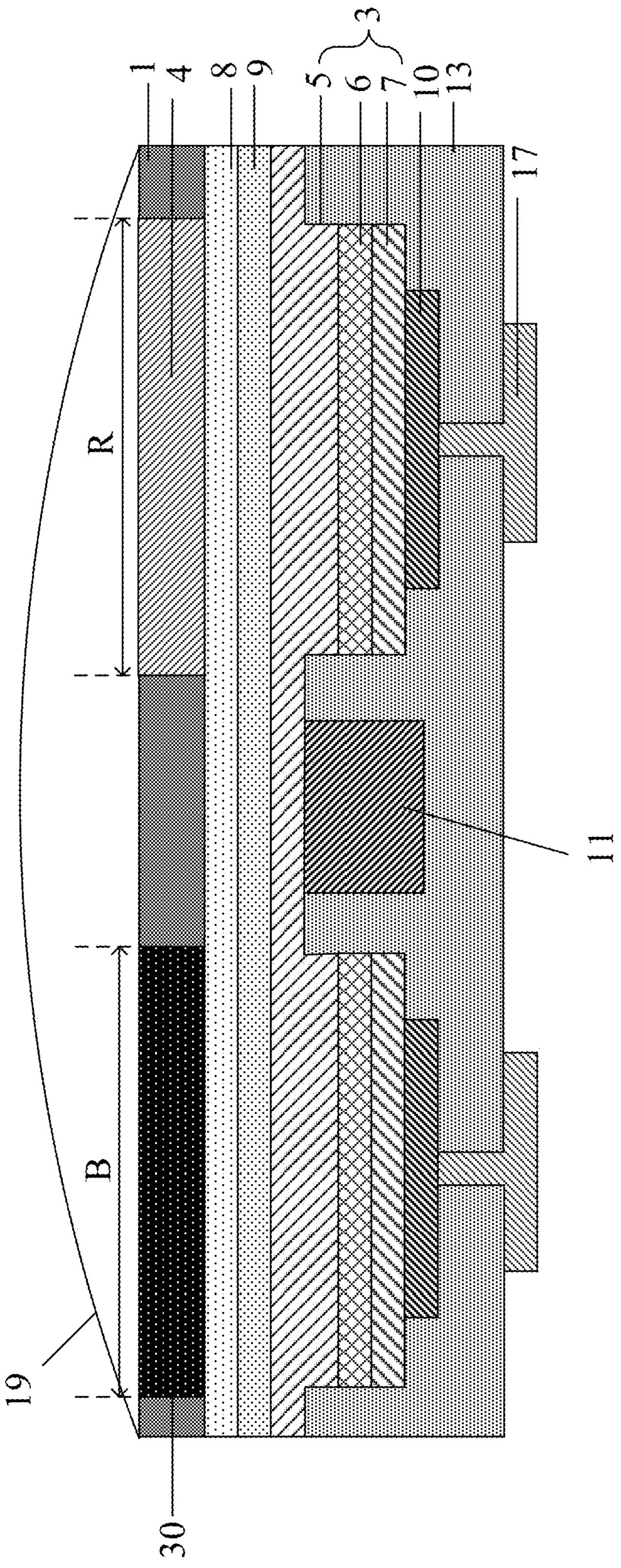
FIG. 5 is a schematic structural diagram of yet another light-emitting chip according to an embodiment of the disclosure.

In some embodiments, as shown in FIG. 5, the light-emitting chip further includes:

a microlens 19 located on a side of the silicon-based substrate 1 away from the light-emitting devices 3, where the microlens 19 covers the sub-pixel openings 2.

In the light-emitting chip provided by the embodiments of the disclosure, the microlens is arranged on the side of the silicon-based substrate away from the light-emitting devices, thereby improving the mechanical strength of the light-emitting chip, avoiding the relatively low mechanical strength of the light-emitting chip due to the thinning process of the silicon-based substrate and the formation of the sub-pixels on the silicon-based substrate, and also improving the light extraction efficiency of the light-emitting chip.

Figure 6:
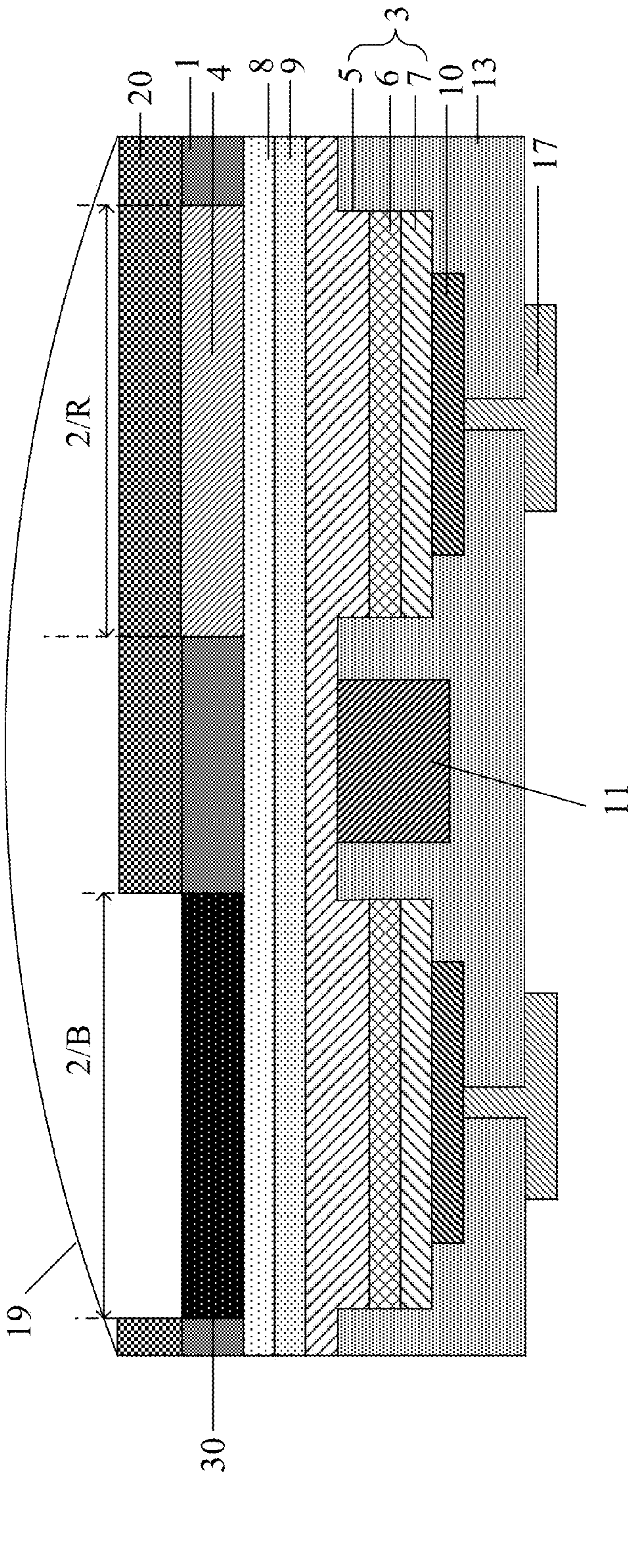
FIG. 6 is a schematic structural diagram of yet another light-emitting chip according to an embodiment of the disclosure.

In some embodiments, as shown in FIG. 6, the light-emitting chip further includes:

a first distributed Bragg reflection structure 20 located between the silicon-based substrate 1 and the microlens 19, covering at least the plurality of photoluminescent color films, and configured to transmit light emitted by the photoluminescent color films and reflect light emitted by the light-emitting devices.

In a specific implementation, the first Bragg reflection structure covers the non-opening region of the silicon-based substrate and the photoluminescent color films.

In a specific implementation, when the protective layer is a protective layer with Bragg reflection structure, the materials of the first Bragg structure and the protective layer with Bragg reflection structure may be the same.

In some embodiments, as shown in FIG. 6, when no photoluminescent color film is included in the sub-pixel opening 2, an orthographic projection of the first distributed Bragg reflection structure 20 on the silicon-based substrate 1 does not overlap with the sub-pixel opening 2.

In a specific implementation, when the light-emitting devices are blue light-emitting devices, and the photoluminescent color films are arranged only in the red sub-pixel opening and the green sub-pixel opening, as shown in FIG. 6, the orthographic projection of the first Bragg reflection structure 20 on the silicon-based substrate 1 does not overlap with the blue sub-pixel opening B. The first Bragg reflection structure transmits the red light and green light and reflects the blue light. The first Bragg reflection structure may be a $TiO_2$/$SiO_2$ stack.

In a specific implementation, when a photoluminescence color film is arranged in each sub-pixel opening, the first Bragg reflection structure may be set to cover all sub-pixel opening regions and non-opening regions of the silicon-based substrate. For example, when the light-emitting devices are ultraviolet light-emitting devices and all sub-pixel opening regions covering the silicon-based substrate are provided with quantum dot color films, the first Bragg reflection structure may be set to cover all sub-pixel opening regions and non-opening regions of the silicon-based substrate. The first Bragg reflection structure transmits the red light, green light and blue light, and reflects the ultraviolet light.

Figure 7:
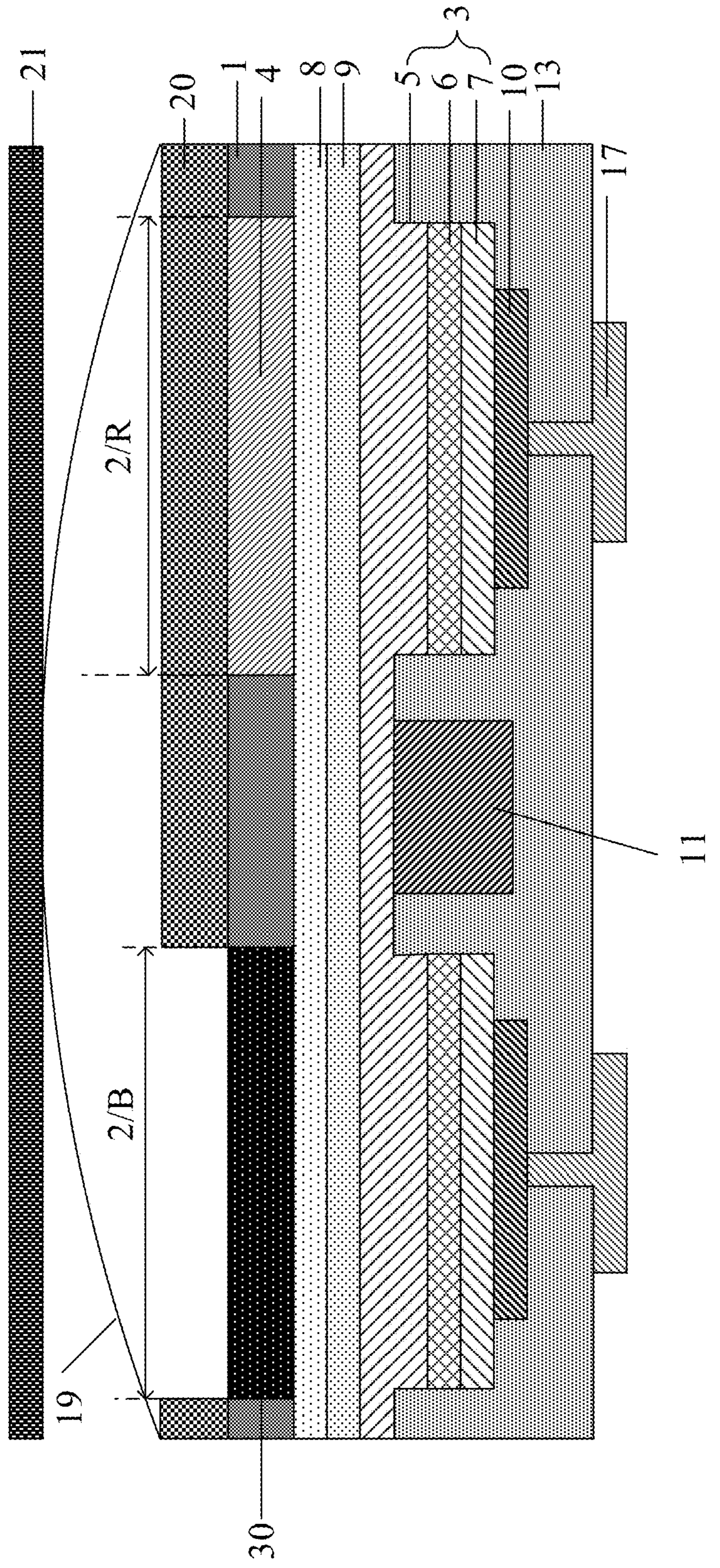
FIG. 7 is a schematic structural diagram of yet another light-emitting chip according to an embodiment of the disclosure.

In some embodiments, as shown in FIG. 7, the light-emitting chip further includes:

a light filter film 21 located on a side of the microlens 19 away from the silicon-based substrate 1.

The light-emitting chip provided by the embodiments of the disclosure is provided with the light filter film on the side of the microlens away from the silicon-based substrate, thereby improving the color purity of the light emitted by the light-emitting chip.

In a specific implementation, the light filter film may be an ultraviolet (UV) filter film or a blue film.

Figure 8:
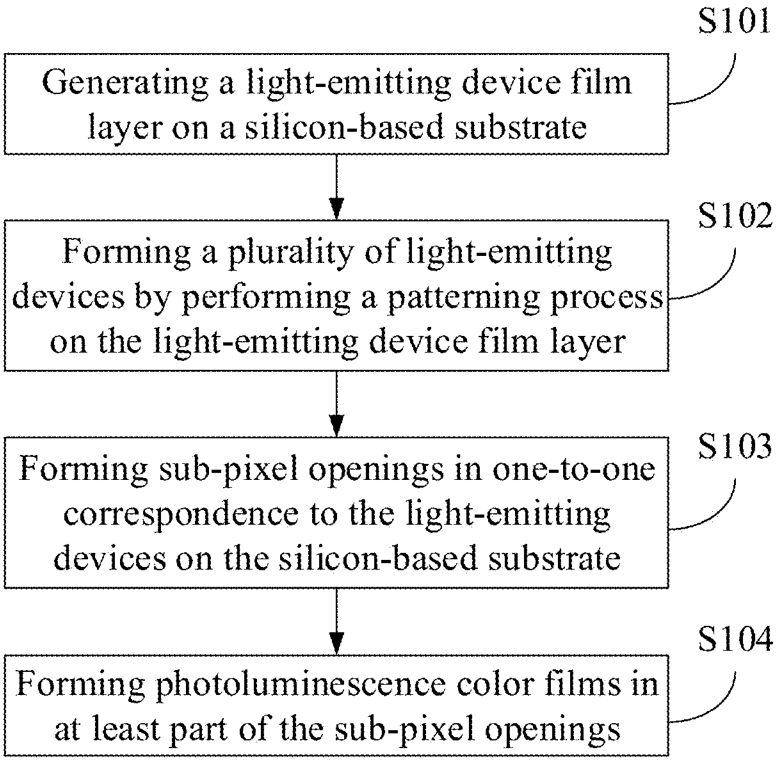
FIG. 8 is a schematic flowchart of a preparation method of a light-emitting chip according to an embodiment of the disclosure.

Based on the same inventive concept, an embodiment of the disclosure further provides a preparation method of a light-emitting chip, as shown in FIG. 8, including:

S101: generating a light-emitting device film layer on a silicon-based substrate;

S102: performing a patterning process on the light-emitting device film layer to form a plurality of light-emitting devices;

S103: forming sub-pixel openings in one-to-one correspondence to the light-emitting devices on the silicon-based substrate;

S104: forming photoluminescence color films in at least part of the sub-pixel openings.

In the preparation method of the light-emitting chip provided by the embodiment of the disclosure, the sub-pixel openings in one-to-one correspondence to the light-emitting devices are formed on the silicon-based substrate, and the photoluminescent color films are arranged in the sub-pixel openings of the silicon-based substrate, that is, the silicon-based substrate is used as a light-shielding black matrix, so that there is no need to additionally arrange a black matrix layer on the side of the silicon-based substrate away from the light-emitting devices, which can save the preparation process of the light-emitting chip and save the cost. The process of forming the sub-pixel openings on the silicon-based substrate is simple, which can avoid increasing the preparation difficulty of the sub-pixel openings. Moreover, the farther the distance from the light-emitting side of the light-emitting device is, the greater the divergence of the light emitted by the light-emitting device is, so the reflection of a part of the light between the interfaces of the light-emitting chip is easily forms the crosstalk. In the light-emitting chip provided by the embodiment of the disclosure, the photoluminescent color films are arranged the sub-pixel openings of the silicon-based substrate, instead of arranging the photoluminescent color films in the openings of the black matrix layer that is additionally arranged on the side of the silicon-based substrate away from the light-emitting devices. The distances between the photoluminescent color films and the light-emitting devices can be reduced, avoiding the problem of crosstalk between different pixels.

Figure 9A:
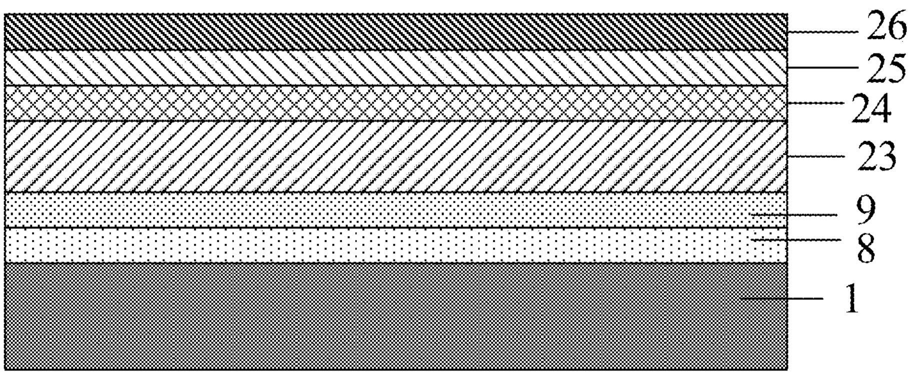
FIGS. 9A to 9H are schematic flowcharts of another preparation method of a light-emitting chip according to an embodiment of the disclosure.

In some embodiments, the S101 of generating the light-emitting device film layer on the silicon-based substrate, as shown in FIG. 9A, specifically includes:

generating an N-type gallium nitride layer 23, a multi-quantum well layer 24, a P-type gallium nitride layer 25 and a first connection electrode layer 26 sequentially on one side of the silicon-based substrate 1.

Figure 9B:
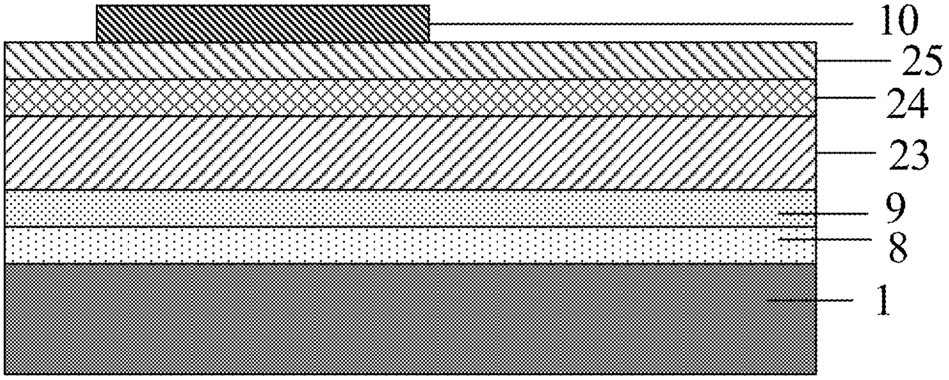

Before the S102 of performing the patterning process on the light-emitting device film layer to form the plurality of light-emitting devices, as shown in FIG. 9B, the method further includes:

performing a patterning process on the first connection electrode layer 26 to form patterns of a plurality of first connection electrodes 10.

Figure 9C:
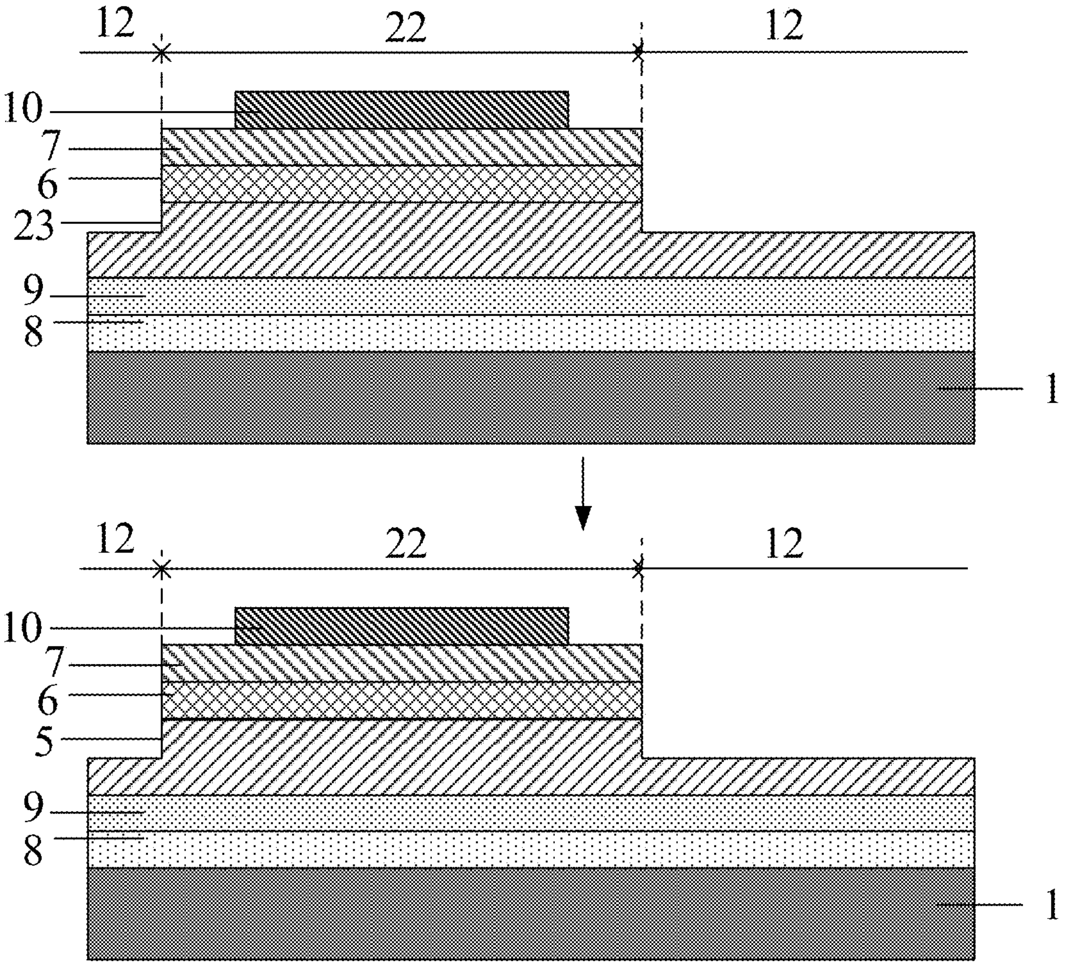

The performing the patterning process on the light-emitting device film layer to form the plurality of light-emitting devices, as shown in FIG. 9C, specifically includes:

performing a patterning process on the P-type gallium nitride layer 25, multi-quantum well layer 24 and N-type gallium nitride layer 23 to form a pattern of P-type gallium nitride 7 corresponding to the light-emitting devices and a pattern of the multi-quantum well layer 6; where the N-type gallium nitride 5 of the plurality of light-emitting devices is integrally connected.

Figure 9D:
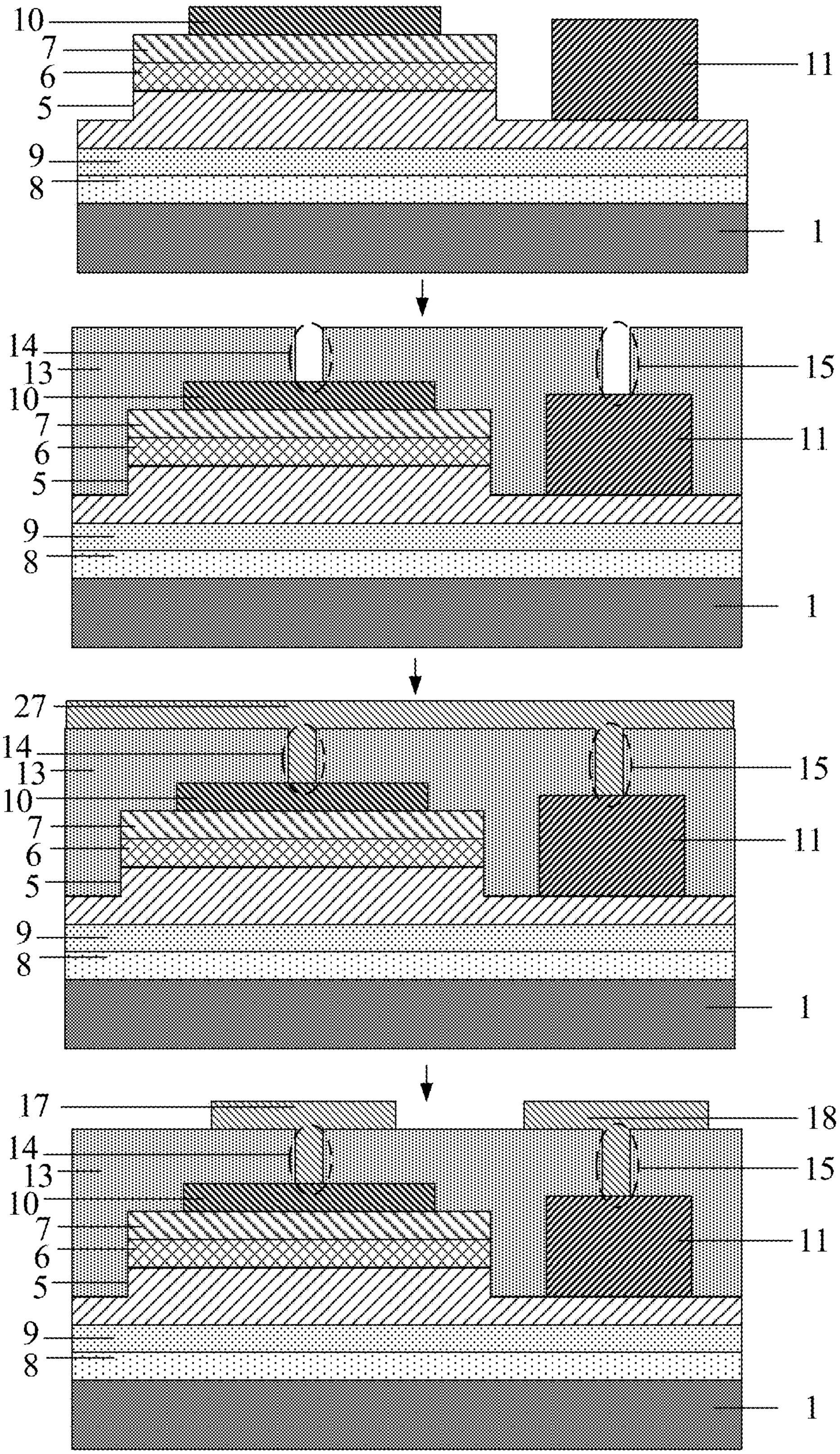

After performing the patterning process on the light-emitting device film layer to form the plurality of light-emitting devices, as shown in FIG. 9D, the method further includes:

forming a pattern of a second connection electrode 11 in a region outside the light-emitting devices and on a side of the N-type gallium nitride 5 away from the silicon-based substrate 1;

forming a protective layer 13 covering the first connection electrodes 10 and the second connection electrode 11, and performing a patterning process on the protective layer 13 to form first via holes 14 exposing the first connection electrodes 10 and a second via hole 15 exposing the second connection electrode 11; and forming a binding pad layer 27 on a side of the protective layer 13 away from the first connection electrodes 10 and the second connection electrode 11, and performing a patterning process on the binding pad layer 27, to form first binding pads 17 electrically connected to the first connection electrodes 10 through the first via holes 14, and a second binding pad 18 electrically connected to the second connection electrode 11 through the second via hole 15.

In a specific implementation, as shown in FIG. 9C, the patterning process is firstly performed on the P-type gallium nitride layer 25, the multi-quantum well layer 24 and the N-type gallium nitride layer 23, to form the patterns of the P-type gallium nitride 7 and the multi-quantum well 6 and remove a part of the N-type gallium nitride layer 23 in the non-light-emitting region 12, thereby realizing the division of the light-emitting region 22 and the non-light-emitting region 12 of the light-emitting chip; and then the patterning process is performed on the N-type gallium nitride layer 23, to remove more N-type gallium nitride layer 23 in the non-light-emitting region 12 again, but the N-type gallium nitride with a certain thickness remains in the non-light-emitting region 12.

In a specific implementation, the first connection electrode layer may be patterned by the dry etching process or wet etching process. The P-type gallium nitride layer, the multi-quantum well layer and the N-type gallium nitride layer may be patterned by the dry etching process.

In a specific implementation, an $SiO_2$ layer or $SiN_x$ layer covering the first connection electrodes and the second connection electrode may be formed to form a protective layer. Alternatively, a Bragg reflection structure covering the first connection electrodes and the second connection electrode may also be formed to form a protective layer with Bragg reflection structure, which may be a stack of $SiO_2$/$SiN_x$ or a stack of $SiO_2$/$TiO_2$ or the like.

Figure 9E:
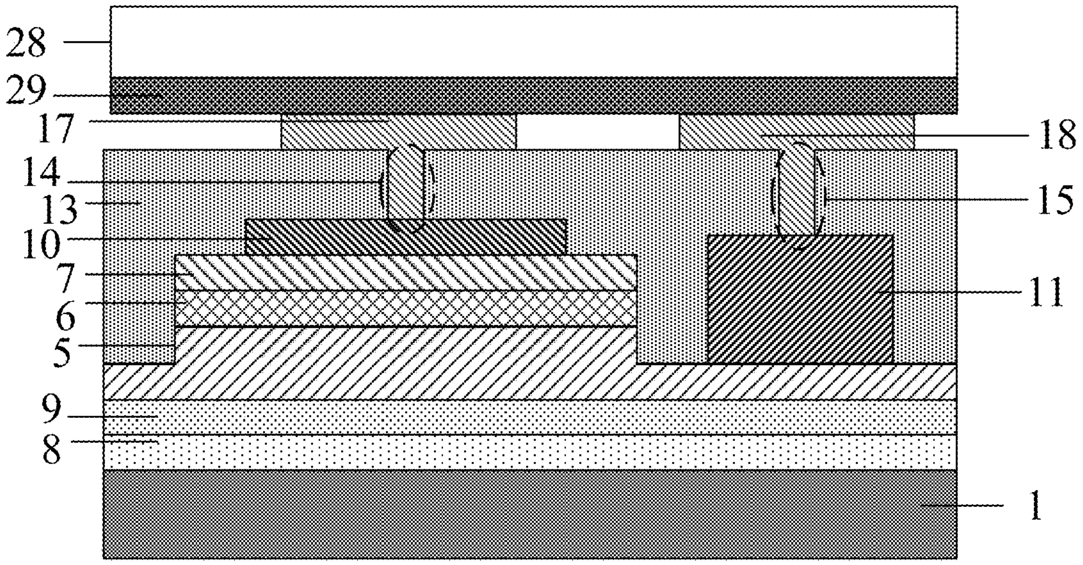

In some embodiments, before forming the sub-pixel openings in one-to-one correspondence to the light-emitting devices on the silicon-based substrate, as shown in FIG. 9E, the method further includes:

bonding a first substrate 28 on a side of the first binding pads 17 and the second binding pad 18 away from the protective layer 13.

In some embodiments, bonding the first substrate on the side of the first binding pads and the second binding pad away from the protective layer, as shown in FIG. 9E, specifically includes:

coating laser dissociation temporary bonding glue 29 on one side of the first substrate 28, and contacting the first binding pads 17 and the second binding pad 18 on the side where the laser dissociation temporary bonding glue 29 is coated, so that the first binding pads 17 and the second binding pad 18 are bonded to the first substrate 28.

In a specific implementation, the first substrate is, for example, a quartz substrate, a sapphire substrate, a glass substrate, etc.

In a specific implementation, the laser dissociation temporary bonding glue is a double-layer bonding glue including a laser active layer and an adhesive layer, and the thickness of the laser dissociation temporary bonding glue is greater than or equal to 1 micron and less than or equal to 30 microns, for example, the thickness of the laser dissociation temporary bonding glue is 5 microns.

Figure 9F:
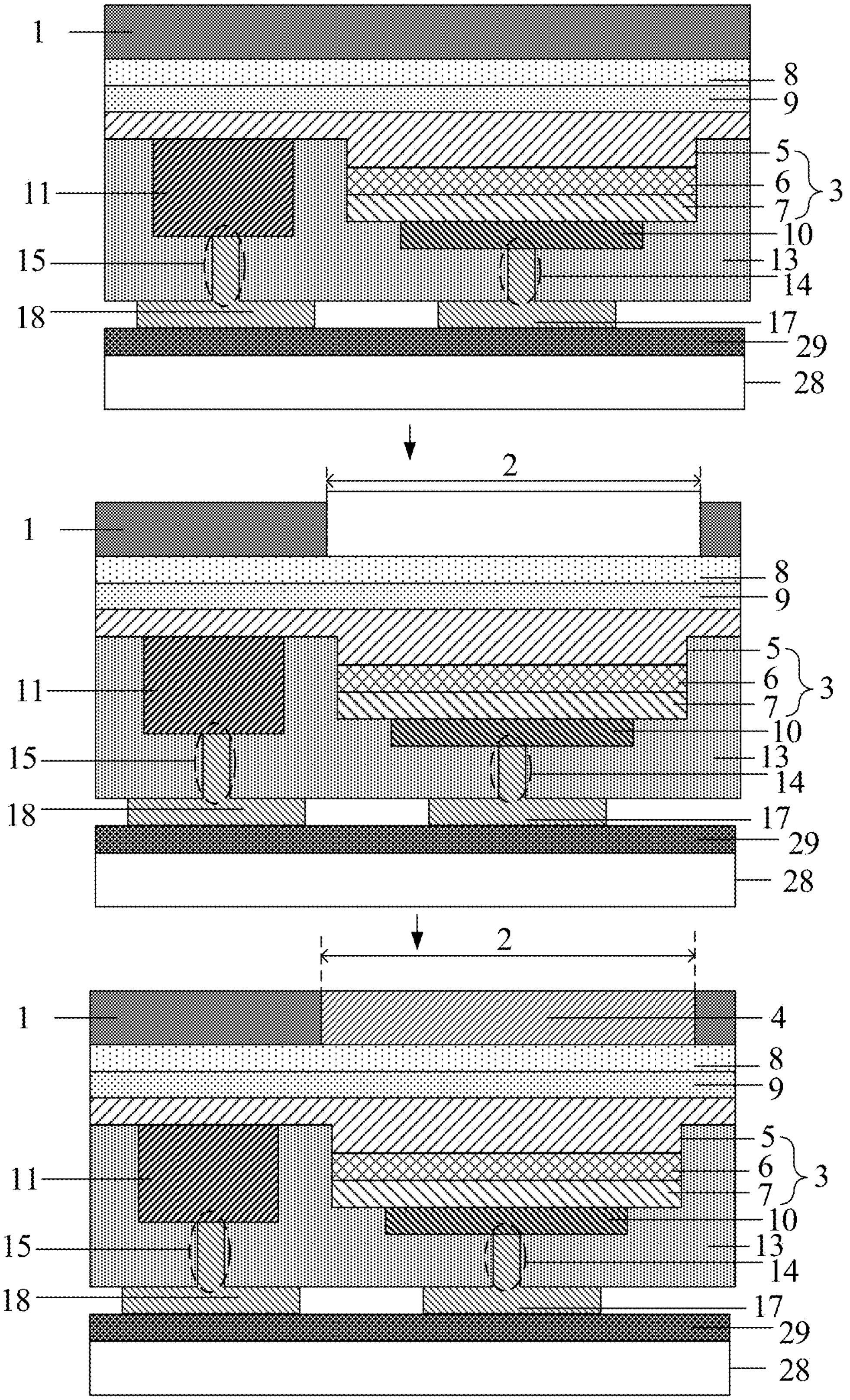

In some embodiments, forming the sub-pixel openings in one-to-one correspondence to the light-emitting devices on the silicon-based substrate, as shown in FIG. 9F, specifically includes:

performing a thinning process on the silicon-based substrate 1 on a side of the silicon-based substrate 1 away from the light-emitting devices; and performing a dry etching process or a wet etching process on the thinned silicon-based substrate 1 to form the sub-pixel openings 2 in one-to-one correspondence to the light-emitting devices.

In a specific implementation, the silicon-based substrate may be thinned by the Chemical Mechanical Polishing (CMP) process or dry etching process. Then the sub-pixel openings may be formed by the wet etching or dry etching process.

It should be noted that, if the substrate is other substrate such as sapphire, the laser peeling-off process is required to form the sub-pixel openings. The laser peeling-off process has the thermal stress, which easily affects the preparation yield of light-emitting chips. However, in the preparation method of the light-emitting chip provided by the embodiments of the disclosure, the silicon-based substrate is used and processed by the dry etching or wet etching process to form the sub-pixel openings, thereby eliminating the need for the laser peeling-off process, that is, there is no thermal stress in the process of forming the sub-pixel openings, and the preparation yield of light-emitting chips can be improved.

After the sub-pixel openings are formed, in a specific implementation, the quantum dot color films may be formed in at least part of the sub-pixel openings by a printing process or photolithography process.

When the light-emitting devices are blue light devices, a red quantum dot color film may be printed in the red sub-pixel opening, and a green quantum dot color film may be printed in the green sub-pixel opening. When the light-emitting devices are ultraviolet devices, a red quantum dot color film may be printed in the red sub-pixel opening, a green quantum dot color film may be printed in the green sub-pixel opening, and a blue quantum dot color film may be printed in the blue sub-pixel opening.

Figure 9G:
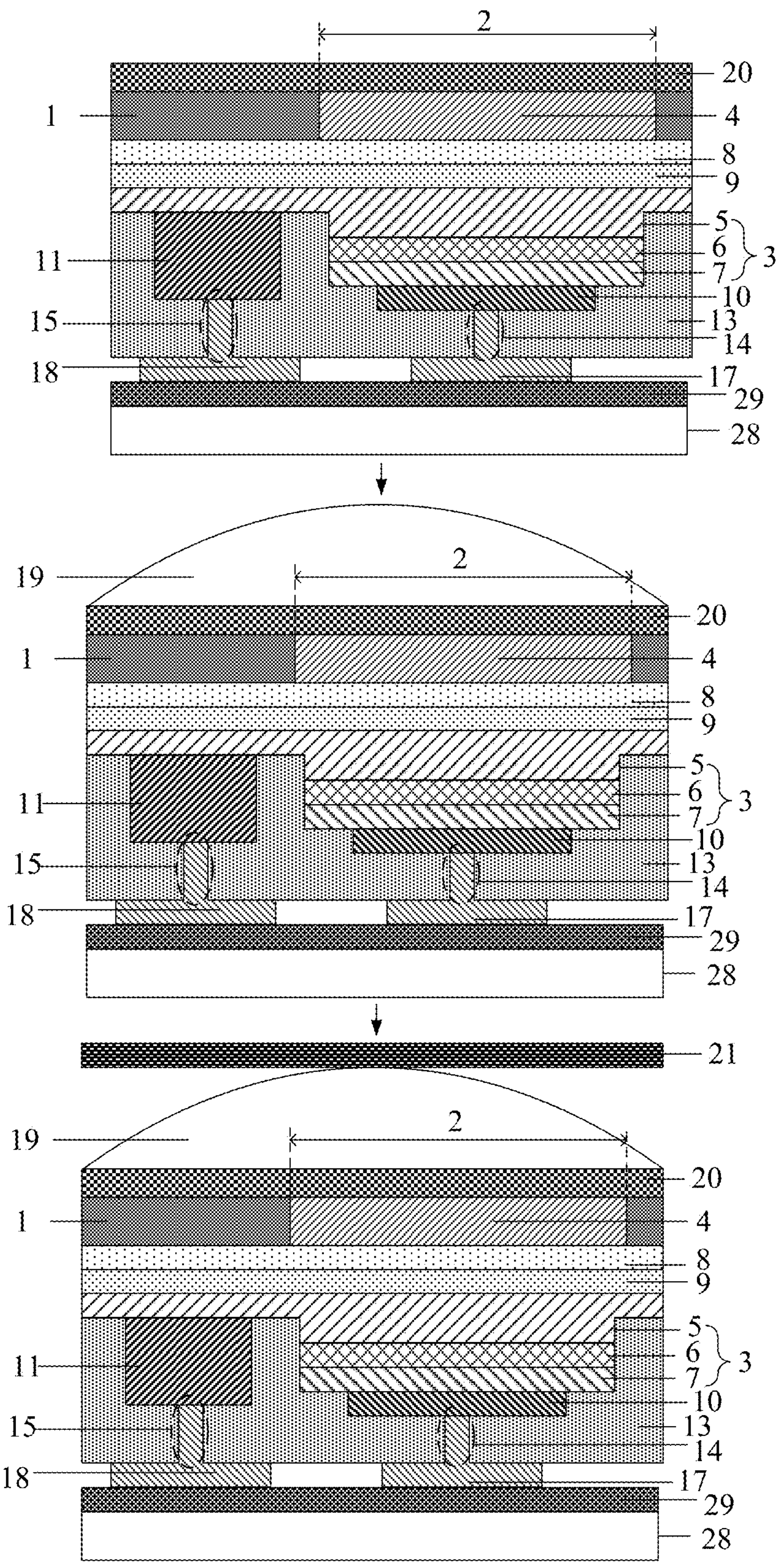

In some embodiments, after forming the photoluminescent color films in at least part of the sub-pixel openings, as shown in FIG. 9G, the method further includes:

forming a microlens 19 on a side of the silicon-based substrate 1 away from the light-emitting devices.

In some embodiments, before forming the microlens on the side of the silicon-based substrate away from the light-emitting devices, as shown in FIG. 9G, the method further includes:

forming a first distributed Bragg reflection structure 20 on the side of the silicon-based substrate 1 away from the light-emitting devices; where the first distributed Bragg reflection structure 20 at least covers a plurality of photoluminescent color films 4.

In some embodiments, as shown in FIG. 6, when no photoluminescent color film is included in the sub-pixel opening 2, an orthographic projection of the first distributed Bragg reflection structure 20 on the silicon-based substrate 1 does not overlap with the sub-pixel opening 2.

In a specific implementation, when the light-emitting devices are blue light-emitting device, and the photoluminescent color films are arranged only in the red sub-pixel opening and the green sub-pixel opening, the orthographic projection of the first Bragg reflection structure on the silicon-based substrate does not overlap with the blue sub-pixel opening.

In some embodiments, after forming the microlens on the side of the silicon-based substrate away from the light-emitting devices, as shown in FIG. 9*g*, the method further includes:

forming a light filter film 21 on a side of the microlens 19 away from the silicon-based substrate.

Figure 9H:
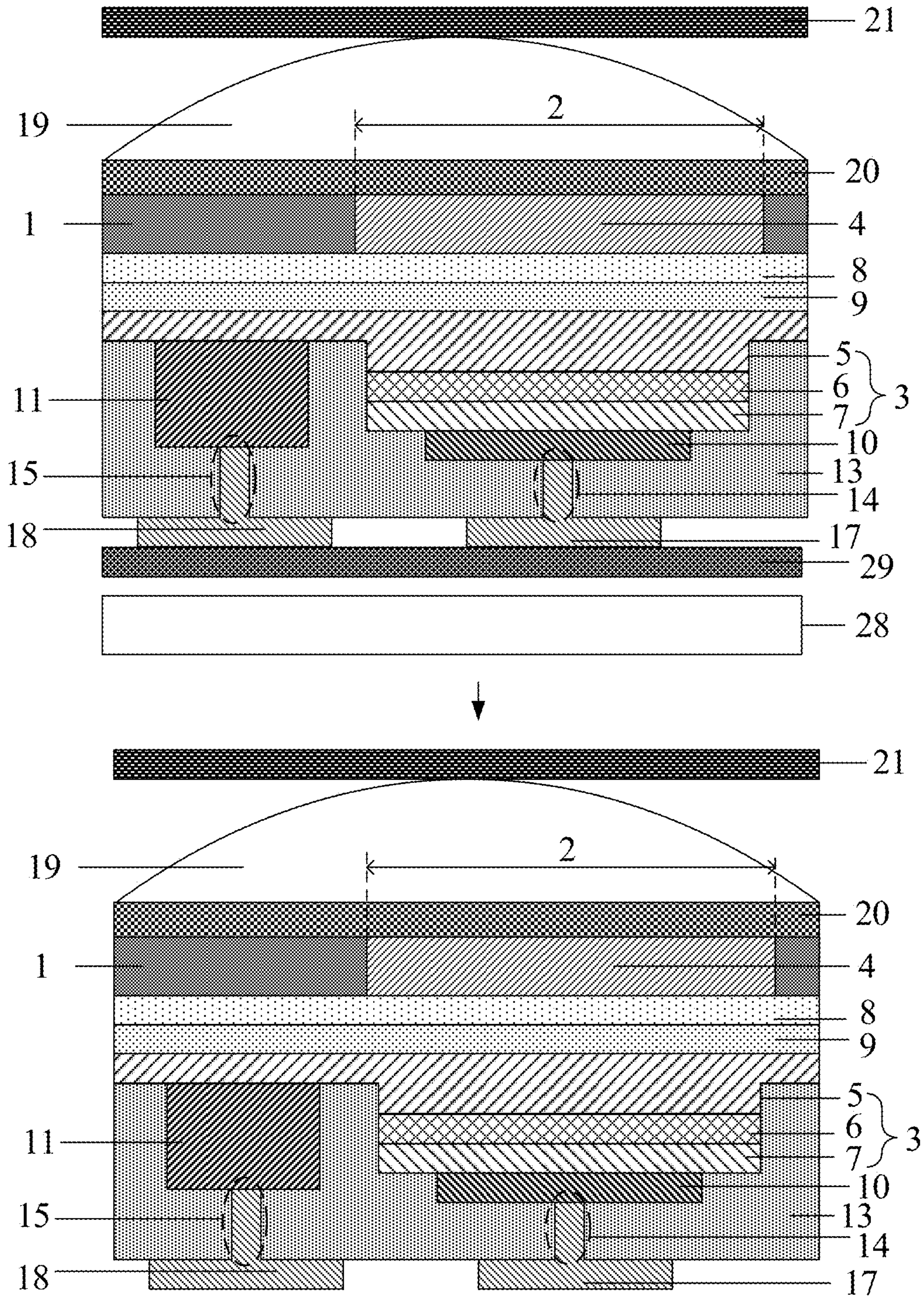

In some embodiments, after forming the light filter film on the side of the microlens away from the silicon-based substrate, as shown in FIG. 9H, the method further includes:

peeling off the first substrate 28.

In some embodiments, peeling off the first substrate, specifically includes:

peeling off the first substrate from the first binding pads and the second binding pad by a laser dissociation process.

In a specific implementation, when the double-layer laser dissociation temporary bonding glue is dissociated by the laser dissociation process, for example, by the laser with a wavelength of 308 nanometers (nm), the dissociation energy is 100 millijoules/square centimeter ($mJ/cm^2$) to 500 $mJ/cm^2$, and for example, may be 250 $mJ/cm^2$.

An embodiment of the disclosure provides a light-emitting substrate, including a plurality of light-emitting chips according to the embodiments of the disclosure arranged in an array.

In some embodiments, the light-emitting substrate further includes a drive backplane to which the plurality of light-emitting chips are bound.

In a specific implementation, the drive backplane includes a drive circuit, which includes pixel drive units in one-to-one correspondence to the light-emitting chips, where one light-emitting chip is bound to one pixel drive unit.

In a specific implementation, the light-emitting chips may be bound to the drive backplane through the first binding pads and second binding pads, so as to provide signals to the first binding pads and the second binding pads through the drive backplane, to drive the light-emitting devices to emit light.

In a specific implementation, the light-emitting chips may be bound to the drive backplane by a transfer process.

In a specific implementation, the light-emitting chip provided by the embodiment of the disclosure includes a plurality of light-emitting devices, and the color conversion is performed by the photoluminescent color films to realize the full-color light-emitting chip. That is, one light-emitting chip can correspond to one pixel, thereby reducing the number of light-emitting chips transferred, reducing the transfer difficulty of the light-emitting chips, reducing the transfer cost of the light-emitting chips, and increasing the pixel density of the light-emitting substrate.

An embodiment of the disclosure provides a display device, including the light-emitting substrate according to the embodiment of the disclosure.

In some embodiments, the display device further includes a display panel located on the light-emitting side of the light-emitting substrate. That is, the light-emitting substrate is used as a backlight module of the display panel. In a specific implementation, the display panel is a liquid crystal display panel.

An embodiment of the disclosure provides a display device, including the display substrate according to the embodiment of the disclosure.

The display device according to the embodiment of the disclosure is a mobile phone, a tablet, a television, a display, a laptop, a digital photo frame, a navigator, or any other product or component with display function. All of other indispensable components of the display device should be understood by those ordinary skilled in the art to be included, and will be omitted here and should not be considered as limitations on the disclosure. The implementations of this display device can refer to the embodiments of the above-mentioned light-emitting chip, and the repeated description thereof will be omitted here.

To sum up, in the light-emitting chip and preparation method thereof, the light-emitting substrate and the display device provided by the embodiments of the disclosure, the photoluminescent color films are arranged in the sub-pixel openings of the silicon-based substrate, that is, the silicon-based substrate is used as a light-shielding black matrix, so that there is no need to additionally arrange a black matrix layer on the side of the silicon-based substrate away from the light-emitting devices, which can save the preparation process of the light-emitting chip and save the cost. The process of forming the sub-pixel openings on the silicon-based substrate is simple, which can avoid increasing the preparation difficulty of the sub-pixel openings. Moreover, the farther the distance from the light-emitting side of the light-emitting device is, the greater the divergence of the light emitted by the light-emitting device is, so the reflection of a part of the light between the interfaces of the light-emitting chip is easily forms the crosstalk. In the light-emitting chip provided by the embodiment of the disclosure, the photoluminescent color films are arranged the sub-pixel openings of the silicon-based substrate, instead of arranging the photoluminescent color films in the openings of the black matrix layer that is additionally arranged on the side of the silicon-based substrate away from the light-emitting devices. The distances between the photoluminescent color films and the light-emitting devices can be reduced, avoiding the problem of crosstalk between different pixels.

Although the preferred embodiments of the invention have been described, those skilled in the art can make additional alterations and modifications to these embodiments once they learn about the basic creative concepts. Thus the attached claims are intended to be interpreted to include the preferred embodiments as well as all the alterations and modifications falling within the scope of the invention.

Evidently those skilled in the art can make various modifications and variations to the embodiments of the invention without departing from the spirit and scope of the embodiments of the invention. Thus the invention is also intended to encompass these modifications and variations therein as long as these modifications and variations to the embodiments of the invention come into the scope of the claims of the invention and their equivalents.

What is claimed is:

1. A light-emitting chip, comprising:

a silicon-based substrate comprising a plurality of sub-pixel openings;

a plurality of light-emitting devices arranged on one side of the silicon-based substrate; wherein the light-emitting devices are in one-to-one correspondence to the sub-pixel openings, and orthographic projections of the light-emitting devices on the silicon-based substrate overlap with the sub-pixel openings;

a plurality of photoluminescent color films located in at least part of the sub-pixel openings;

a microlens located on a side of the silicon-based substrate away from the light-emitting devices, wherein the microlens covers the sub-pixel openings.

2. The light-emitting chip according to claim 1, further comprising:

a first distributed Bragg reflection structure located between the silicon-based substrate and the microlens, covering at least the plurality of photoluminescent color films, and configured to transmit light emitted by the photoluminescent color films and reflect light emitted by the light-emitting devices.

3. The light-emitting chip according to claim 2, wherein when no photoluminescent color film is comprised in the sub-pixel opening, an orthographic projection of the first distributed Bragg reflection structure on the silicon-based substrate does not overlap with the sub-pixel opening.

4. The light-emitting chip according to claim 1, further comprising:

a light filter film located on a side of the microlens away from the silicon-based substrate.

5. The light-emitting chip according to claim 1, wherein the light-emitting devices are micro-sized inorganic light-emitting diodes.

6. The light-emitting chip according to claim 5, wherein the light-emitting device comprises: N-type gallium nitride, a multi-quantum well layer and P-type gallium nitride stacked on one side of the silicon-based substrate; and the N-type gallium nitride of the plurality of light-emitting devices is integrally connected.

7. The light-emitting chip according to claim 6, further comprising:

a plurality of first connection electrodes located on a side of the P-type gallium nitride away from the multi-quantum well layer; wherein the first connection electrodes are electrically connected to the P-type gallium nitride in one-to-one correspondence, and orthographic projections of the first connection electrodes on the silicon-based substrate fall into orthographic projections of the P-type gallium nitride on the silicon-based substrate;

a second connection electrode located in a region outside the light-emitting devices and electrically connected to the N-type gallium nitride on a side of the N-type gallium nitride away from the silicon-based substrate;

a protective layer, located on a side of the first connection electrodes and the second connection electrode away from the silicon-based substrate, and comprising: a plurality of first via holes penetrating through a thickness of the protective layer and exposing the first connection electrodes, and a second via hole penetrating through the thickness of the protective layer and exposing the second connection electrode; and a plurality of binding pads, located on a side of the protective layer away from the first connection electrodes and the second connection electrode, and comprising: first binding pads electrically connected to the first connection electrodes in one-to-one correspondence through the first via holes, and a second binding pad electrically connected to the second connection electrode through the second via hole.

8. The light-emitting chip according to claim 1, wherein the plurality of light-emitting devices comprised in the light-emitting chip are all blue light-emitting devices;

the plurality of sub-pixel openings comprise: a red sub-pixel opening, a blue sub-pixel opening, and a green sub-pixel opening; and the plurality of photoluminescent color films comprise: a red light quantum dot color film that absorbs blue light and emits red light, and a green light quantum dot color film that absorbs blue light and emits green light; wherein the red light quantum dot color film is located in the red sub-pixel opening, and the green light quantum dot color film is located in the green sub-pixel opening.

9. The light-emitting chip according to claim 1, wherein the plurality of light-emitting devices comprised in the light-emitting chip are all ultraviolet light-emitting devices;

the plurality of sub-pixel openings comprise: a red sub-pixel opening, a blue sub-pixel opening, and a green sub-pixel opening; and the plurality of photoluminescent color films comprise: a red light quantum dot color film that absorbs ultraviolet light and emits red light, a blue light quantum dot color film that absorbs ultraviolet light and emits blue light, and a green light quantum dot color film that absorbs ultraviolet light and emits green light; wherein the red light quantum dot color film is located in the red sub-pixel opening, the blue light quantum dot color film is located in the blue sub-pixel opening, and the green light quantum dot color film is located in the green sub-pixel opening.

10. The light-emitting chip according to claim 1, wherein a thickness of the silicon-based substrate is greater than or equal to 5 microns and less than or equal to 50 microns.

11. The light-emitting chip according to claim 1, wherein a distance between the light-emitting device and the photoluminescent color film is greater than or equal to 0.1 micron and less than or equal to 50 microns.

12. The light-emitting chip according to claim 1, wherein the orthographic projections of the light-emitting devices on the silicon-based substrate fall into the sub-pixel openings.

13. A preparation method of the light-emitting chip according to claim 1, comprising:

generating a light-emitting device film layer on the silicon-based substrate;

forming the plurality of light-emitting devices by performing a patterning process on the light-emitting device film layer;

forming the sub-pixel openings in one-to-one correspondence to the light-emitting devices on the silicon-based substrate;

forming the photoluminescence color films in at least part of the sub-pixel openings;

forming the microlens on the side of the silicon-based substrate away from the light-emitting devices.

14. The method according to claim 13, wherein the generating the light-emitting device film layer on the silicon-based substrate, further comprises:

generating an N-type gallium nitride layer, a multi-quantum well layer, a P-type gallium nitride layer and a first connection electrode layer sequentially on one side of the silicon-based substrate;

before forming the plurality of light-emitting devices by performing the patterning process on the light-emitting device film layer, the method further comprises:

forming patterns of a plurality of first connection electrodes by performing a patterning process on the first connection electrode layer;

the forming the plurality of light-emitting devices by performing the patterning process on the light-emitting device film layer, further comprises:

forming a pattern of P-type gallium nitride and a pattern of the multi-quantum well layer corresponding to the light-emitting devices by performing a patterning process on the P-type gallium nitride layer, multi-quantum well layer and N-type gallium nitride layer; wherein the N-type gallium nitride of the plurality of light-emitting devices is integrally connected;

after forming the plurality of light-emitting devices by performing the patterning process on the light-emitting device film layer, the method further comprises:

forming a pattern of a second connection electrode in a region outside the light-emitting devices and on a side of the N-type gallium nitride layer away from the silicon-based substrate;

forming a protective layer covering the first connection electrodes and the second connection electrode, and forming first via holes exposing the first connection electrodes and a second via hole exposing the second connection electrode by performing a patterning process on the protective layer; and forming a binding pad layer on a side of the protective layer away from the first connection electrodes and the second connection electrode, and forming first binding pads electrically connected to the first connection electrodes through the first via holes, and a second binding pad electrically connected to the second connection electrode through the second via hole by performing a patterning process on the binding pad layer.

15. The method according to claim 14, wherein before forming the sub-pixel openings in one-to-one correspondence to the light-emitting devices on the silicon-based substrate, the method further comprises:

bonding a first substrate on a side of the first binding pads and the second binding pad away from the protective layer;

after forming a filter film on a side of the microlens away from the silicon-based substrate, the method further comprises:

peeling off the first substrate.

16. The method according to claim 15, wherein the bonding the first substrate on the side of the first binding pads and the second binding pad away from the protective layer, further comprises:

coating laser dissociation temporary bonding glue on one side of the first substrate, and contacting the first binding pads and the second binding pad on the side where the laser dissociation temporary bonding glue is coated, so that the first binding pads and the second binding pad are bonded to the first substrate;

the peeling off the first substrate, further comprises:

peeling off the first substrate from the first binding pads and the second binding pad by a laser dissociation process.

17. The method according to claim 13, wherein the forming the sub-pixel openings in one-to-one correspondence to the light-emitting devices on the silicon-based substrate, further comprises:

performing a thinning process on the silicon-based substrate on a side of the silicon-based substrate away from the light-emitting devices; and forming the sub-pixel openings in one-to-one correspondence to the light-emitting devices by performing a dry etching process or a wet etching process on the thinned silicon-based substrate.

18. A light-emitting substrate, comprising a plurality of light-emitting chips arranged in an array, wherein each of the plurality of light-emitting chips is according to claim 1.

19. A display device comprising the light-emitting substrate according to claim 18.

20. A light-emitting chip, comprising:

a silicon-based substrate comprising a plurality of sub-pixel openings;

a plurality of light-emitting devices arranged on one side of the silicon-based substrate; wherein the light-emitting devices are in one-to-one correspondence to the sub-pixel openings, and orthographic projections of the light-emitting devices on the silicon-based substrate overlap with the sub-pixel openings; and a plurality of photoluminescent color films located in at least part of the sub-pixel openings;

wherein the light-emitting devices are micro-sized inorganic light-emitting diodes;

the light-emitting device comprises: N-type gallium nitride, a multi-quantum well layer and P-type gallium nitride stacked on one side of the silicon-based substrate; and the N-type gallium nitride of the plurality of light-emitting devices is integrally connected.

* * * * *